United States Patent [19]

Worley

[11] 4,139,819
[45] Feb. 13, 1979

[54] MULTIFUNCTION FREQUENCY COUNTER

[76] Inventor: Eugene R. Worley, 8961 Jade Cir., Westminster, Calif. 92683

[21] Appl. No.: 856,528

[22] Filed: Dec. 1, 1977

[51] Int. Cl.² ............................................. G01R 23/14
[52] U.S. Cl. ................................ 324/79 D; 324/78 D; 324/79 R
[58] Field of Search ................ 324/78 R, 78 D, 78 Z, 324/79 R, 79 D, 81; 328/134, 140

[56] References Cited

U.S. PATENT DOCUMENTS

| | | | |
|---|---|---|---|
| 3,673,391 | 6/1972 | Lougheed | 324/79 D |
| 3,917,927 | 11/1975 | Minton | 324/78 D |
| 4,020,418 | 4/1977 | Barrage | 324/78 D |
| 4,057,756 | 11/1977 | Leg | 324/78 D |

Primary Examiner—M. Tokar
Attorney, Agent, or Firm—W. Edward Johansen

[57] ABSTRACT

The present invention is an improved multifunction frequency counter for use in combination with a crystal oscillator, which includes a crystal and a pair of crystal load capacitors and with a digital display. The improved multifunction frequency counter includes a first frequency divider for dividing the output frequency of the crystal oscillator to one Megahertz and a second frequency divider for dividing the one Megahertz to one thousand Hertz, a three decade down counter, which is preset at 999, and a decode logic element which provides an output signal to an enabling device, a signal gate having its first input coupled to a pulse shaping device which includes an input amplifier electrically coupled to a schmitt trigger, a second input electrically coupled to the enabling device and a third input electrically coupled to the output of the first frequency divider. The signal gate has pulsed output. The improved multifunction frequency counter also includes a six stage decade up counter having a binary coded decimal output which is electrically coupled to the signal gate and a storage latch which is electrically coupled to the binary coded decimal output of the six stage decade up counter. The improved multifunction frequency counter further includes a binary coded decimal to seven segment decoder electrically coupled to the storage latch, a segment driver which is electrically coupled to the digital display and to the binary coded decimal to seven segment decoder.

6 Claims, 2 Drawing Figures

MULTIFUNCTION FREQUENCY COUNTER

BACKGROUND OF THE INVENTION

1. Field of the Invention

The present invention relates to multifunction frequency counters which may be manufactured on a single semiconductor chip and more particularly to multifunction frequency counters which function as frequency counters, period measuring devices and counters.

2. Description of the Prior Art

Presently the circuitry for most multifunction frequency counters is implemented by the use of a collection of conventional logic elements. These logic elements include a BCD ripple up counter, which is described in the National Semiconductor CMOS Databook, an A/C coupled amplifier, which is also described in the National Semiconductor CMOS Databook, "D" flip-flops, which are described in the RCA COS/MOS Integrated Circuits Databook, a Crystal Oscillator, which is described in the RCA COS/MOS Integrated Circuits Databook, a Johnson Counter, which is described in the RCA COS/MOS Integrated Circuits Databook, and a Binary ripple counter, which is also described in the RCA COS/MOS Integrated Circuits Databook. These logic elements are electrically coupled to form a multifunction frequency counter.

Another multifunction frequency counter is formed when an Intersil Complementary MOS Oscillator Controller, ICM7207A, is electrically coupled to an Intersil Frequency Counter, IMC7208. This combination of logic element enables the multifunction frequency counter to obtain seven significant digits when measuring frequencies over one megaHertz.

U.S. Pat. No. 4,047,114, entitled Digital Detector, issued to Richard A. Lane and Donald K. Fronek on Sept. 6, 1977, teaches a digital detector for detecting the presence of selected frequencies in an input signal. The digital detector includes a counting device having an input and an output, a NAND gate having a first input and a second input and an output, with the output of the NAND gate being electrically coupled to the input of the counting device, and a shaping device having an input for receiving the input frequency signals and an output for providing a shaped gating pulse. The output of the shaping device is electrically coupled to the first input of the NAND gate. The digital detector also includes a pulse generator having an output electrically coupled to the second input of the NAND gate and a gating input electrically coupled to the output of the shaping device and a decoder circuit electrically coupled to the output of the counting device for responding to the output of the counting device to provide output pulses which are a function of the detector input frequency signals.

U.S. Pat. No. 3,854,277, entitled Electronic Stop-Watch and Timepiece, issued to Toshihide Samejima and Yasuhiro Ooi on Dec. 17, 1974, teaches an electronic timekeeping device capable of functioning both as a stop-watch and as a timepiece. A signal generator includes a crystal oscillator and provides a base frequency which is divided in a plurality of stages of frequency dividers and is then counted on counters that effect a time count displayed visually on a time display. The time count is applied from the counters to display elements through latch circuits which constitute storage circuits under the control of latch controlling device when the device function as a stop-watch and through these latch or storage circuits.

A Mostek MOS Counter Time-Base Circuit, MK 5009p, is a highly versatile MOS oscillator which is manufactured by a depletion-load, ion-implantation process and P-channel technology. With an input frequency on one Megahertz, the MOS Counter Time-Base Circuit provides the basic time periods necessary for most frequency measuring instruments.

None of the above-described circuits integrates all of the functions of a multifunction frequency counter onto one complementary metal oxide silicon/large scale integration, CMOS/LSI, chip. Furthermore there is no single multifunction frequency counter chip presently available that requires no external active components.

SUMMARY OF THE INVENTION

In view of the foregoing factors and conditions characteristic of the prior art it is a primary object of the present invention to provide circuitry for a multifunction frequency counter that can be implemented on one CMOS/LSI chip.

It is another object of the present invention to provide a multifunction frequency counter which may be gated by one of a plurality of gate times in order measure frequencies from a few Hertz to tens of Megahertz.

It is still another object of the present invention to provide a multifunction frequency counter that may be electrically coupled to a digital display.

It is yet another object of the present invention to provide a multifunction frequency counter which can measure the period for low frequencies on the order of a few Hertz.

It is still yet another object of the present invention to provide a multifunction frequency counter that can count and display the count of electronic pulses.

In accordance with an embodiment of the present invention an improved multifunction frequency counter for use in combination with a crystal oscillator, which includes a crystal and a pair of crystal load capacitors, and with a digital display is described. The multifunction frequency counter includes a first frequency divider for dividing the output frequency of the crystal oscillator to one Megahertz and a second frequency divider for dividing the one Megahertz to one thousand Hertz, a three decade down counter, which is preset at 999, and a decode logic element which provides an output signal to an enabling device, a signal gate having its first input coupled to a pulse shaping device, which includes an input amplifier electrically coupled to a schmitt trigger, a second input electrically coupled to the enabling device and a third input electrically coupled to the output of the first frequency divider. The signal gate has a pulsed output. The improved multifunction frequency counter also includes a six stage decade up counter having a binary coded decimal output which is electrically coupled to the signal gate and a storage latch which is electrically coupled to the binary coded decimal output of the six stage decade up counter. The improved multifunction frequency counter further includes a binary coded decimal to seven segment decoder electrically coupled to the storage latch, a segment driver which is electrically coupled to the digital display and to the the binary coded decimal to seven segment decoder.

The features of the present invention which are believed to be novel are set forth with particularity in the appended claims.

Other objects and many of the attendant advantages will be more readily appreciated as the same becomes better understood by reference to the following detailed description and considered in connection with the accompanying drawing in which like reference symbols designate like parts throughout the figures.

DESCRIPTION OF THE DRAWING

FIG. 1b is a schematic drawing of the other half of the circuitry of the multifunction frequency counter of FIG. 1a.

DESCRIPTION OF THE PREFERRED EMBODIMENT

Figure 1A:
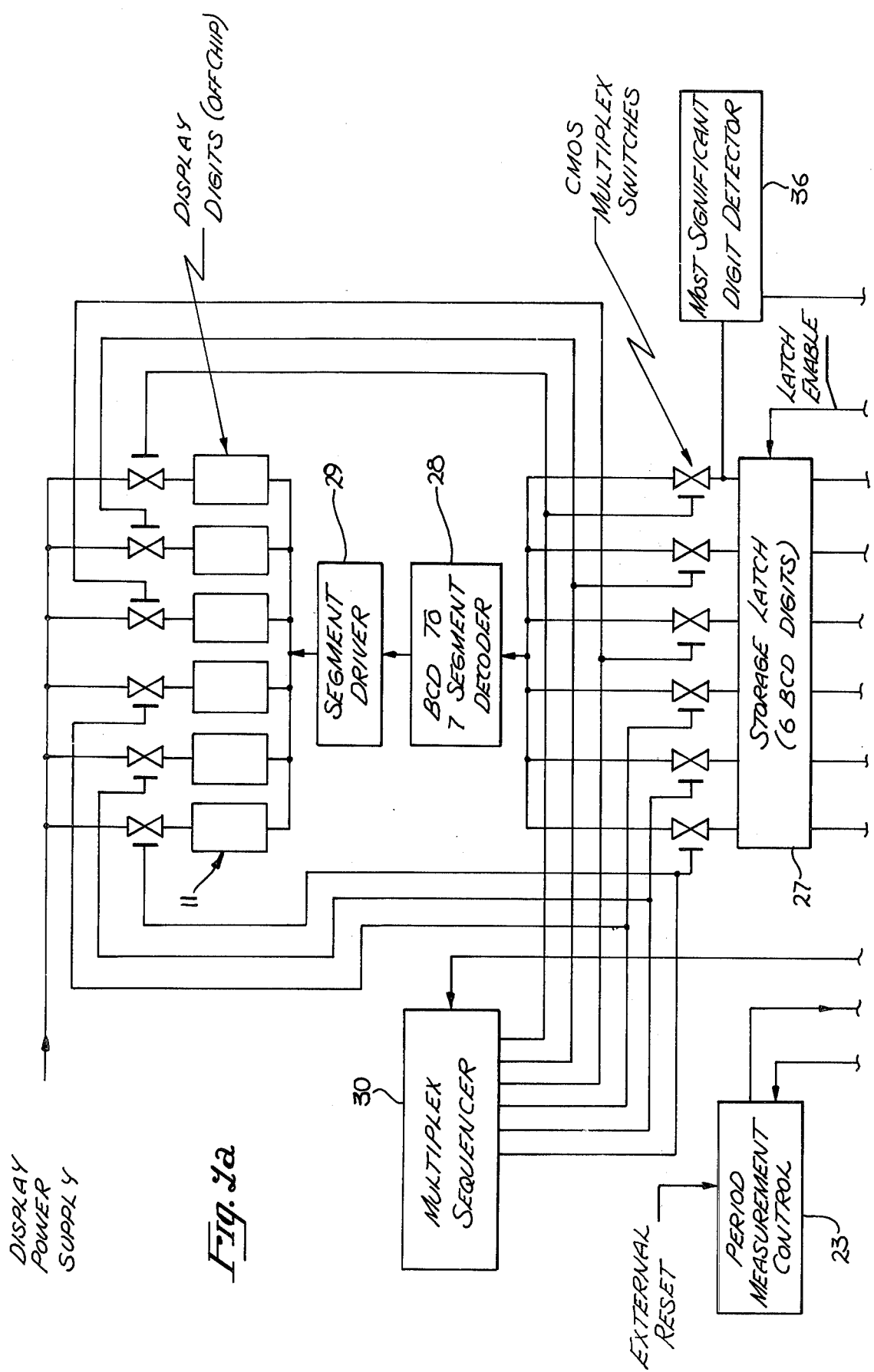
FIG. 1a is a schematic drawing of one half of the circuitry of a multifunction frequency counter, which is constructed in accordance with the principles of the present invention.
Figure 4B:
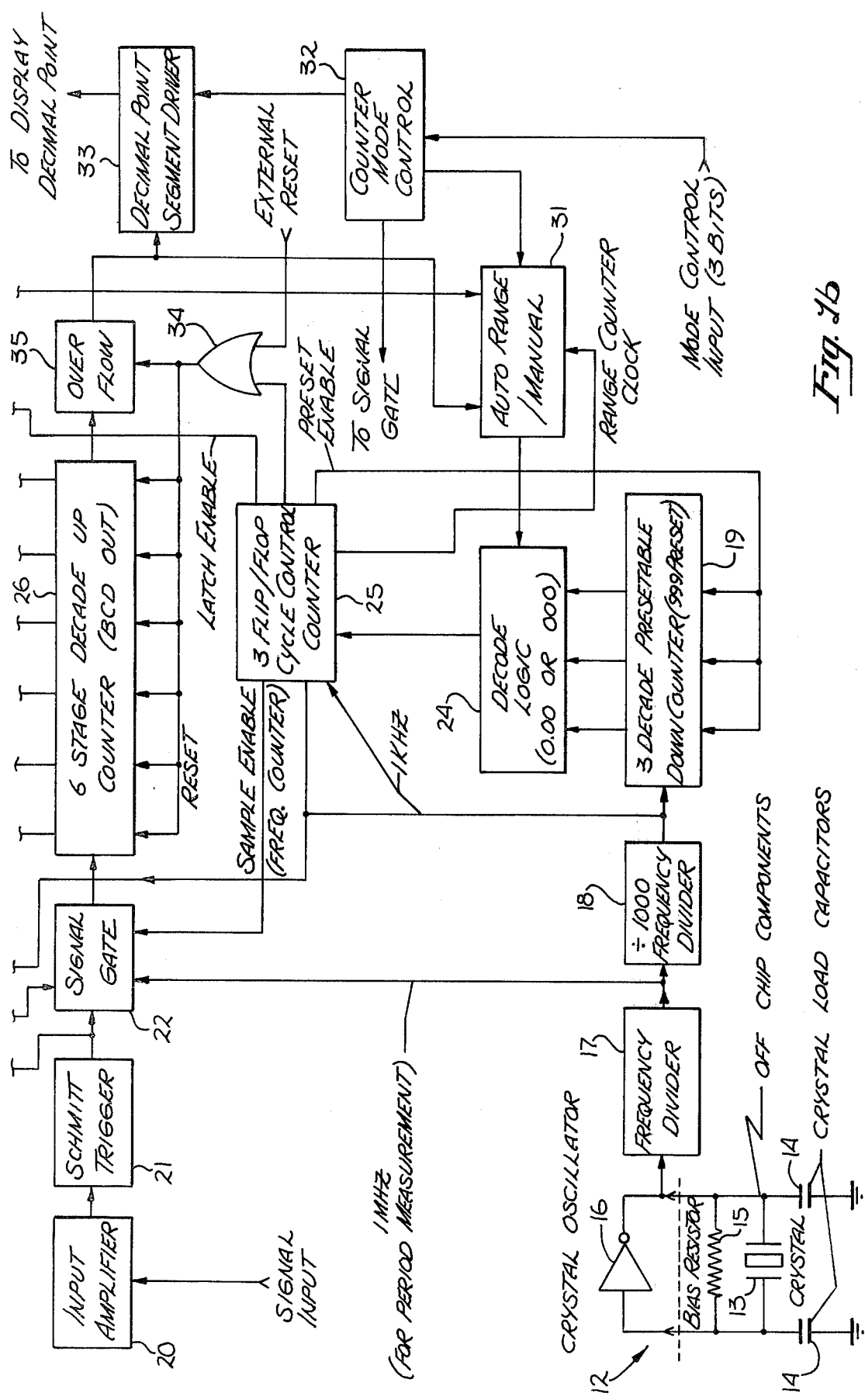

In order to best understand the present invention it is necessary to refer to a description of its preferred embodiment in conjunction with the accompanying drawing. The preferred embodiment of the present invention is a multifunction frequency counter 10 shown in FIG. 1a and FIG. 1b. The multifunction frequency counter 10 is electrically coupled to a digital display 11 and to external components of a crystal oscillator 12 which include a crystal 13, a pair of crystal load capacitors 14 electrically coupled to ground and to the crystal 13 and a bias resistor 15 electrically coupled in parallel to the crystal 13. The multifunction frequency counter 10 includes an amplifier 16, the input and output of which are electrically coupled in parallel to the crystal 13 and the bias resistor 15 to form the crystal oscillator 12, a first frequency divider 17, which divides the output frequency of the crystal oscillator 12 down to one Megahertz, a second frequency divider 18, which divides the one Megahertz down to one thousand Hertz and a three decade presettable down counter 19, which is preset at 999 and which is counted down by the one thousand Hertz signal from the second frequency divider 18. The multifunction frequency counter 10 also includes an input amplifier 20, which is adapted to receive a signal input, a schmitt trigger 21, which receives the amplified signal input and provides a series of pulses in response to the frequency of the signal input, a signal gate 22, which has a first input electrically coupled to the output of the schmitt trigger, a second input electrically coupled to one Megahertz output of the first frequency divider 17 and a third input and a period adjustment control 23, which is also electrically coupled to the first input of the signal gate 22.

The multifunction frequency counter 10 further includes a decode logic element 24, which is electrically coupled to the three decade presettable down counter 19 and which provides a signal in response to a setting of XY0, X00 or 000 therein, a three flip-flop cycle control counter 25 which receives the signal from the decode logic element 24 and transmit a sample enable signal to the third input of the signal gate 22, the output of which is electrically coupled to a six stage decade up counter 26 having a binary coded decimal output and a storage latch 27 which stores each of the six binary coded decimal digits and which is controlled by a latch enable signal from the three flip-flop cycle control counter 25. The multifunction frequency counter 10 also further includes a binary coded decimal to seven segment decoder 28, which is electrically coupled to the storage latch 27, a segment driver 29 and a multiplexer sequencer 30, which is electrically coupled to both the storage latch 27 and to the digital display 11 so that each digit may be multiplexed through the binary coded decimal to seven segment decoder 28 and the segment driver 29 to the digital display 11.

In operation, the crystal oscillator 12, a detailed description of which can be found in ICAN 6086 of the 1975 RCA COS/MOS databook, provides a frequency that can be counted down to one Megahertz and one thousand Hertz. The one thousand Hertz frequency is fed into the three decade ripple down counter 19 which has been preset at 999 and the counter 19 counts down at a rate of one thousand Hertz. The decode logic element 24 is connected to the output of the down counter 19 and provides a signal when it sees an "XY0" (units), an "X00" (tens) or an "000" (hundreds) state. The selection of the decode state is provided by an automatic range/manual logic element 31 and it determines the gate time. For example, an "XY0" state corresponds to ten counts or a 0.01 second gate time, an "X00" state corresponds to hundred counts or a 0.1 second gate time, and an "000" state corresponds to thousand counts or a 1.0 second gate time. The output of the decode logic element 24 is fed as data into the three flip-flop cycle control counter 25 which is used to control the operation of the main six stage decade up counter 26. The cycle control counter 25 resets the up counter 26 and is itself run by the one thousand Hertz signal. A count cycle begins with the six stage decade up counter 26 being reset to zero by the cycle control counter 25. Once the reset operation has been performed the logic of the signal gate 22 allows the up counter 26 to count the electronic pulses which are derived from the input circuits including the input amplifier 20 and the schmitt trigger 21. The purpose of the input of these input circuits is to first amplify the input signal to CMOS logic levels and then square up the signal by generating fast logic level transition times. The up counter 26 counts the pulses for one gate time interval. At the end of the gate time interval the signal gate 22 is commanded by the cycle control counter 25 to shut off the input signal. The count is then allowed to stabilize before being strobed into the storage latch 27. The data that is held in the storage latch 27 is then multiplexed onto a four bit, binary coded decimal line at a multiplexing frequency of one thousand Hertz. The signals controlling the multiplex gates 32 are generated by a three stage Johnson counter called the "multiplexer sequencer 30". From the output of the multiplex gates 32 the data is transferred to the binary coded decimal to seven segment decoder 28 so that the data may be viewed on a digital display 11 such as a liquid crystal display. The segment driver 29 is required to interface the display drive requirements with the CMOS logic and the $V_{ss}$ return switches are used to phase the digital display 11 with the proper binary coded decimal digit.

The Auto Range/Manual switch 31 controls the three stateup counter 25 as counter state corresponds to a gate time. When in the auto range mode the counter is toggled by the cycle control circuit after each latch enable pulse unless it has been inhibited. The signals are used to determine if the counter's clock is to be inhibited by the overflow signal and the most significant digit signal. The overflow signal results when the most significant digit signal cyles from a 9 to a 0 without being reset. The most significant digit signal is a result of the most significant digit being a number other than a 0.

The auto range counter is stopped under the following conditions: when the counter is in the 000 decode state and there is no overflow signal; when the counter is in the X00 decode state and there is an most significant digit signal but no overflow signal; and when the counter is in the XY0 decode state and there is a most significant digit signal present.

The three state auto/range manual counter may be asynchronously set or reset for manual ranging.

Period measurement is performed by the period measurement control 23. When the counter is in the period measurement mode the latch enable signal is on permanently. Period measurement is initiated by an external, manual reset signal. The period control will then look for the first positive edge transition of the input signal. The appearance of the first positive edge after the reset pulse will cause the signal gate 22 to connect the one Megahertz signal to the input of the six stage counter 26 which will continue to count the one Megahertz signal until the appearance of the second positive transition of the input at which time the one Megahertz signal is shut off. The count displayed is therefore the period of the input signal in microseconds. Additional period samples may be taken by providing additional external reset signals.

The counter operates in the count mode by having the signal gate 22 connect the input signal to the six stage counter 26. In this mode of operation the latch enable signal is present at all times. To count electronic pulses the counter 26 is first reset to zero by the external reset. After the external reset has been applied the frequency counter will display the subsequent number of electronic pulses appearing at its input. The various modes of operation are controlled by an externally provided three bit number which is generated by panel switches and is used to specify whether the counter is to be controlled and operated in the frequency mode or the count mode. In the frequency mode the three bit number also determines if the counter is to operate in one of the manual range or in the auto range mode.

From the foregoing a multifunction frequency counter has been described.

Accordingly it is intended that the foregoing disclosure and showing made in the drawing shall be considered only as illustration of the present invention. Furthermore it should be noted that the sketches are not drawn to scale and that distances of and between figures are not to be considered significant. The invention will be set forth with particularity in the appended claims.

What is claimed is:

1. An improved multifunction frequency counter for use in combination with a crystal oscillator which includes a crystal and a pair of crystal load capacitors and with a digital display, said improved multifunction frequency counter comprising:
   a. frequency means for providing a plurality of frequencies electrically coupled to the crystal oscillator;
   b. down counting means for counting down from a preset number to zero electrically coupled to said frequency means;
   c. pulse shaping means for shaping an input signal of a particular frequency to be measured;
   d. enabling means for providing an enabling signal electrically coupled to said down counting means;
   e. a signal gate having a first input electrically coupled to said pulse shaping means, a second input electrically coupled to said enabling means and a third input electrically coupled to said frequency means, said signal gate having an output that corresponds to the frequency of the input signal when it is summed for a period of time;
   f. up counting means for counting up the signal from said output of said signal gate; and
   g. display driving means for driving the digital display electrically coupled to said up counting means.

2. An improved multifunction frequency counter according to claim 1 wherein said display driving means comprises:
   a. a binary coded decimal to seven segment decoder electrically coupled to said up counting means;
   b. a segment driver which is electrically coupled to said binary coded decimal to seven segment decoder and which is also electrically coupled to the digital display; and
   c. multiplexing means for multiplexing each unit of the decimal system through the digital display electrically coupled to said frequency means.

3. An improved multifunction frequency counter according to claim 2 wherein said up counting means comprises:
   a. a six stage decade up counter having a binary coded decimal output which is electrically coupled to said signal gate; and
   b. a storage latch which is electrically coupled to said binary coded decimal output of said six stage decade counter in parallel and which is also electrically coupled to both said multiplexing means and said binary coded decimal to seven segment decoder.

4. An improved multifunction frequency counter according to claim 3 wherein said frequency means comprises:
   a. frequency dividing means for dividing the frequency output of the crystal oscillator to one Megahertz; and
   b. a frequency divider for dividng the one Megahertz frequency by 1000 electrically coupled to said frequency dividing means.

5. An improved multifunction frequency counter according to claim 4 wherein said down counting means comprises:
   a. three decade presettable down counter, which is preset at 999, electrically coupled to the output of said frequency divider; and
   b. decode logic element which provides a signal to said enabling means in response to a range setting and to a zero in the first decade, the first and second decades, or the first, second and third decades electrically coupled to said signal gate.

6. An improved multifunction frequency counter according to claim 5 wherein said pulse shaping means comprises:
   a. an input amplifier which amplifies the input signal; and
   b. a schmitt trigger the input of which is electrically coupled to the output of said input amplifier.

* * * * *